US008710581B2

(12) United States Patent
Komiya (10) Patent No.: US 8,710,581 B2
(45) Date of Patent: Apr. 29, 2014

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventor: Ken Komiya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/922,929

(22) Filed: Jun. 20, 2013

(65) Prior Publication Data
US 2013/0277727 A1     Oct. 24, 2013

Related U.S. Application Data

(63) Continuation of application No. 12/826,057, filed on Jun. 29, 2010, now Pat. No. 8,476,696.

(30) Foreign Application Priority Data

Jun. 30, 2009  (JP) .................................. 2009-155825

(51) Int. Cl.
*H01L 29/792*     (2006.01)

(52) U.S. Cl.
USPC .................................. 257/325; 257/E29.309

(58) Field of Classification Search
USPC .......................................... 257/315, 324, 397
See application file for complete search history.

(56) References Cited

U.S. PATENT DOCUMENTS

| 6,617,639 | B1 * | 9/2003 | Wang et al. ................... 257/324 |
| 6,903,422 | B2 | 6/2005 | Goda et al. |
| 7,564,094 | B2 | 7/2009 | Kim et al. |
| 7,635,891 | B2 * | 12/2009 | Natori et al. ................... 257/324 |

(Continued)

FOREIGN PATENT DOCUMENTS

| JP | 2000-286349 A | 10/2000 |
| JP | 2006-114816 | 4/2006 |

(Continued)

OTHER PUBLICATIONS

Chang-Hyun Lee, et al., "Charge Trapping Memory Cell of TANOS (Si—Oxide—SiN—Al$_2$O$_3$-TaN) Structure Compatible to Conventional NAND Flash Memory" IEEE NVSMW 2006, vol. 21, Issue 2006, pp. 54-55.

(Continued)

*Primary Examiner* — David Vu
*Assistant Examiner* — Earl Taylor
(74) *Attorney, Agent, or Firm* — Oblon, Spivak, McClelland, Maier & Neustadt, L.L.P.

(57) ABSTRACT

A nonvolatile semiconductor memory device comprises: element isolation insulating films formed in a semiconductor substrate in a first direction; and element regions formed in a region sandwiched by the element isolation insulating film, with MONOS type memory cells. The MONOS type memory cell comprises: a tunnel insulating film disposed on the element region; a charge storage film disposed continuously on the element regions and the element isolation insulating films. The charge storage film comprises: a charge film disposed on the element region and having a certain charge trapping characteristic; and a degraded charge film disposed on the element isolation insulating film and having a charge trapping characteristic inferior to that of the charge film. The degraded charge film has a length of an upper surface thereof set shorter than a length of a lower surface thereof in a cross-section along the first direction.

4 Claims, 8 Drawing Sheets

(56) References Cited

U.S. PATENT DOCUMENTS

| | | | |
|---|---|---|---|
| 7,648,881 B2 | 1/2010 | Lee | |
| 7,749,919 B2* | 7/2010 | Sakuma et al. | 438/775 |
| 7,825,458 B2* | 11/2010 | Shimizu et al. | 257/324 |
| 7,867,831 B2* | 1/2011 | Shin et al. | 438/128 |
| 7,928,493 B2 | 4/2011 | Cho et al. | |
| 8,030,700 B2* | 10/2011 | Sakamoto | 257/324 |
| 8,039,337 B2 | 10/2011 | Cho et al. | |
| 8,089,114 B2* | 1/2012 | Kim et al. | 257/315 |
| 8,097,531 B2 | 1/2012 | Park et al. | |
| 8,154,069 B2* | 4/2012 | Morikado | 257/316 |
| 8,241,974 B2 | 8/2012 | Cho et al. | |
| 8,247,299 B2* | 8/2012 | Jang et al. | 438/296 |
| 2003/0047755 A1* | 3/2003 | Lee et al. | 257/200 |
| 2006/0255396 A1* | 11/2006 | Nara | 257/315 |
| 2007/0228447 A1 | 10/2007 | Ozawa | |
| 2008/0096340 A1* | 4/2008 | Oh et al. | 438/201 |
| 2008/0149932 A1* | 6/2008 | Natori et al. | 257/66 |
| 2008/0150008 A1 | 6/2008 | Kim et al. | |
| 2009/0159957 A1* | 6/2009 | He et al. | 257/324 |
| 2009/0256192 A1 | 10/2009 | Fujitsuka et al. | |
| 2009/0273018 A1 | 11/2009 | Cho et al. | |
| 2009/0294828 A1 | 12/2009 | Ozawa et al. | |
| 2010/0052039 A1 | 3/2010 | Matsushita et al. | |
| 2010/0240207 A1 | 9/2010 | Park et al. | |
| 2010/0270609 A1* | 10/2010 | Olsen et al. | 257/324 |
| 2011/0018047 A1 | 1/2011 | Komiya | |

FOREIGN PATENT DOCUMENTS

| | | |
|---|---|---|
| JP | 2007-287858 | 11/2007 |
| JP | 2009-54942 | 3/2009 |
| WO | WO 2007/086304 A1 | 8/2007 |

OTHER PUBLICATIONS

Hang-Ting Lue, et al., "Study of Local Trapping and STI Edge Effects on Charge-Trapping NAND Flash", Electron Devices Meeting, 2007, IEDM 2007, IEEE International, 2007, pp. 161-164.

Jae Sung Sim, et al., "Self Aligned Trap-Shallow Trench Isolation Scheme for the Reliability of TANOS (TaN/AlO/SiN/Oxide/Si) NAND Flash Memory" IEEE NVSMW 2007, vol. 22, Issue 2007, pp. 110-111.

Notification of Reason(s) for Refusal issued Jul. 9, 2013 in Japanese Patent Application No. 2009-155825 (with English translation).

* cited by examiner

|  | Low Temp. | High Temp. |
|---|---|---|
| HTO | 1 | 1 |
| TEOS | 2 | 2 |
| ALD-SiO2 | 2.4 | 2.4 |
| PSZ | 16-38 | 10-36 |
| NSG | 14-22 | 14-18 |

NONVOLATILE SEMICONDUCTOR MEMORY DEVICE AND METHOD OF MANUFACTURING THE SAME

CROSS-REFERENCE TO RELATED APPLICATIONS

This application is a continuation of U.S. application Ser. No. 12/826,057, filed Jun. 29, 2010, now U.S. Pat. No. 8,476,696, which claims priority Japanese Patent Application No. 2009-155825, filed on Jun. 30, 2009, the entire contents of both priority documents being incorporated herein by reference.

BACKGROUND OF THE INVENTION

1. Field of the Invention

The present invention relates to a transistor structure utilized in a nonvolatile semiconductor memory device.

2. Description of the Related Art

Large capacity storage devices such as NAND flash memory are widely used in consumer-oriented household electrical goods such as storage cards. Since the storage devices used many of these household electrical goods require high reliability and long-term storage stability.

There are typically two kinds of cell structure in NAND flash memory, namely, floating gate (hereafter referred to as "FG") type structure and MONOS (Metal-Oxide-Nitride-Oxide-Semiconductor) type structure. The FG type structure and MONOS type structure are described below.

In the FG type structure, a charge is stored in a floating gate composed of a conductor (for example, polysilicon) disposed on a gate insulating film (tunnel insulating film) of a MOSFET. The FG type structure stores information based on the difference in the amount of charge stored.

On the other hand, in the MONOS type structure, a charge is stored in a trap level in a charge storage film (for example, a silicon nitride (SiN) film) instead of in the floating gate. The MONOS type structure is similar to the FG type structure in that information is stored based on the difference in the amount of charge stored.

The FG type structure is adopted as the cell structure in NAND flash memory, because the FG type structure has good charge storing (hereafter referred to as "retention") characteristic. On the other hand, the MONOS type structure allows a greater degree of thinning in its charge storage film. As a result, shifting of a threshold voltage in memory cell transistors caused by capacitance coupling with adjacent cells can be reduced. A memory cell transistor with a MONOS type structure is reported in "Charge Trapping Memory Cell of TANOS (Si-Oxide-SiN—Al2O3-TaN) Structure Compatible to Conventional NAND Flash Memory" (IEEE NVSMW 2006. 21st Volume, Issue 2006 pp. 54-55), for example. This memory cell transistor utilizes a tantalum nitride film (TaN) for the control gate electrode, an alumina film ($Al_2O_3$) that is a high dielectric constant insulating film for the block insulating film, a silicon nitride film for the charge storage film, and a silicon oxide film ($SiO_2$) for the tunnel insulating film).

The retention characteristic of the memory cell transistor with the MONOS type structure is required to improve.

The cause of deterioration in the retention characteristic is considered to lie in the method of processing of the tunnel insulating film and the charge storage film. In fact, the retention characteristic is reported not to deteriorate when the tunnel insulating film and the charge storage film are not processed (refer to "Study of Local Trapping and STI Edge Effects on Charge-Trapping NAND Flash", Electron Devices Meeting, 2007. IEDM 2007. IEEE International, pp. 161-164). In a conventional method of manufacturing a memory cell transistor having a MONOS type structure, Reactive Ion Etching (hereafter referred to as "RIE") is used to form element isolation trenches and process the tunnel insulating film and the charge storage film at the same time. Damage to the tunnel insulating film and the charge storage film is thought to occur at that time. Accordingly, a method of manufacturing is reported in which the tunnel insulating film and the charge storage film are deposited subsequent to formation of the element isolation trench (refer to "Self Aligned Trap-Shallow Trench Isolation Scheme for the Reliability of TANOS (TaN/AlO/SiN/Oxide/Si) NAND Flash Memory", IEEE NVSMW 2007. 22st Volume, Issue 2007 pp. 110-111). However, when manufacture is performed by this method, the problem arises that the charge storage films of adjacent memory cell transistors become joined in structure, whereby charge in a charge storage film shifts to an adjacent memory cell transistor.

SUMMARY OF THE INVENTION

In accordance with a first aspect of the present invention, a nonvolatile semiconductor memory device comprises: a semiconductor substrate; element isolation insulating films being along a first direction in the semiconductor substrate with a certain spacing therebetween and reached to a certain depth from a surface of the semiconductor substrate; element regions sandwiched by the element isolation insulating film, with MONOS type memory cells disposed on an upper surface thereof, each of the MONOS type memory cells comprising: a tunnel insulating film formed on one of the element regions; a charge storage film disposed continuously on the element regions and the element isolation insulating films; a block insulating film disposed on the charge storage film; and a control gate electrode disposed on the block insulating film, the charge storage film comprising: a charge film disposed on the one of the element regions and having a certain charge trapping characteristic; and a degraded charge film disposed on one of the element isolation insulating film and having a charge trapping characteristic inferior to that of the charge film, and the degraded charge film having a length of an upper surface thereof set shorter than a length of a lower surface thereof in a cross-section along the first direction.

In accordance with a second aspect of the present invention, a nonvolatile semiconductor memory device comprises: a semiconductor substrate; element isolation insulating films being along a first direction in the semiconductor substrate with a certain spacing therebetween and reached to a certain depth from a surface of the semiconductor substrate; and element regions sandwiched by the element isolation insulating film, with floating gate type memory cells disposed on an upper surface thereof, each of the floating gate type memory cells comprising: a tunnel insulating film disposed on one of the element regions; a floating gate disposed on the tunnel insulating film, having an upper surface higher than an upper surface of the element isolation insulating films; an inter-gate multilayer film disposed continuously on the element isolation insulating films and the floating gate; and a control gate electrode disposed on the inter-gate multilayer film, the inter-gate multilayer film comprising a first inter-gate film and a second inter-gate film formed on the first inter-gate film, and the second inter-gate film comprising: a side surface portion disposed on a side surface of the floating gate and configured from a material having a dielectric constant higher than that of the first inter-gate film; and an upper surface portion disposed on the element isolation insulating films and having fewer charge traps than the side surface portion.

In accordance with a third aspect of the present invention, a method of manufacturing a nonvolatile semiconductor memory device comprises: forming a plurality of element isolation trenches along a first direction with a certain spacing therebetween, the plurality of element isolation trenches reaching a certain depth from a surface of a semiconductor substrate; filling the element isolation trench with an insulating film including an oxidizing agent, thereby forming an element isolation insulating film; forming a tunnel insulating film of a MONOS type memory cell on a surface of an element region, the element region divided by the element isolation insulating film; forming a charge storage film of the MONOS type memory cell continuously on the element region and the element isolation insulating film; and using heat treatment to diffuse the oxidizing agent included in the element isolation insulating film and oxidize the charge storage film formed on the element isolation insulating film, thereby forming a degraded charge film.

DETAILED DESCRIPTION OF THE EMBODIMENTS

Embodiments of a nonvolatile semiconductor memory device and a method of manufacturing the same in accordance with the present invention are described in detail below with reference to the drawings.

First Embodiment

Figure 1:
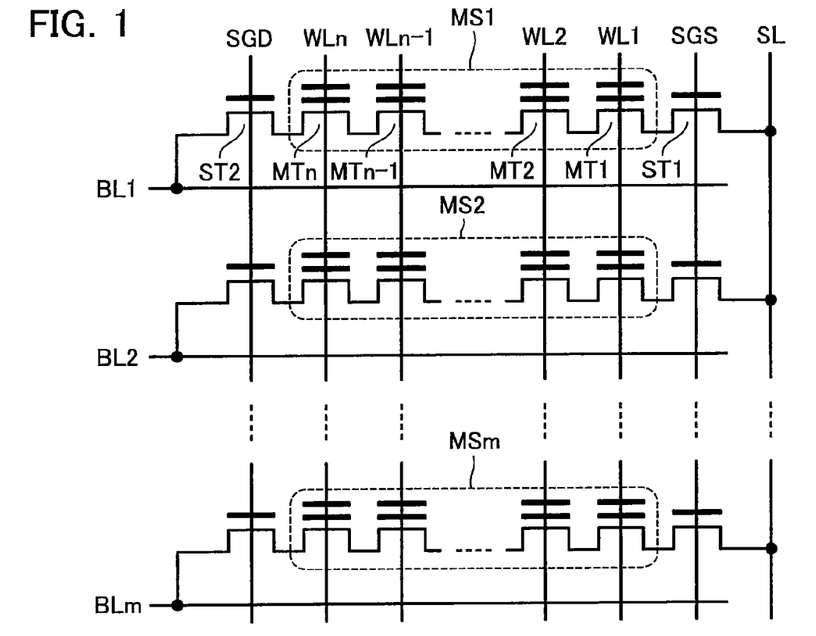
FIG. 1 is an equivalent circuit diagram of a cell array in a nonvolatile memory in accordance with a first embodiment of the present invention.

The nonvolatile memory in accordance with a first embodiment of the present invention comprises a NAND flash memory, and an equivalent circuit diagram of a cell array in this nonvolatile memory is as shown in FIG. 1.

That is, the cell array in the nonvolatile memory of the present embodiment comprises a plurality of word lines WL1-WLn (where n is integer greater than or equal to 1) and a plurality of bit lines BL1-BLm (where m is an integer greater than or equal to 1) that intersect each other. In addition, this cell array includes a source line SL, a source side select gate line SGS, and a drain side select gate line SGD extending in a word line WL direction. Furthermore, this cell array has arranged therein a plurality of memory strings MS1-MSm, each of which comprises a plurality of memory cell transistors MT1-MTn connected in series. Here, the memory cell transistor MTi (where i is an integer from 1 to n) is configured by a transistor with a MONOS type structure to be described hereafter, and the m memory cell transistors MTi belonging to the memory strings MSj (where j is an integer from 1 to m) have their control gate electrodes commonly connected to the word line WLi. In addition, a select transistor ST1 is provided to one end of each of the memory strings MSj, the memory string MSj being connected to the source line SL via this select transistor ST1. Meanwhile, a select transistor ST2 is provided to the other end of each of the memory strings MSj, the memory string MSj being connected to the bit line BLj via this select transistor ST2. Here, the m select transistors ST1 and ST2 have their gate electrodes commonly connected to the source side select gate line SGS and the drain side select gate line SGD, respectively.

[Structure of Memory Cell Transistor]

Figure 2:
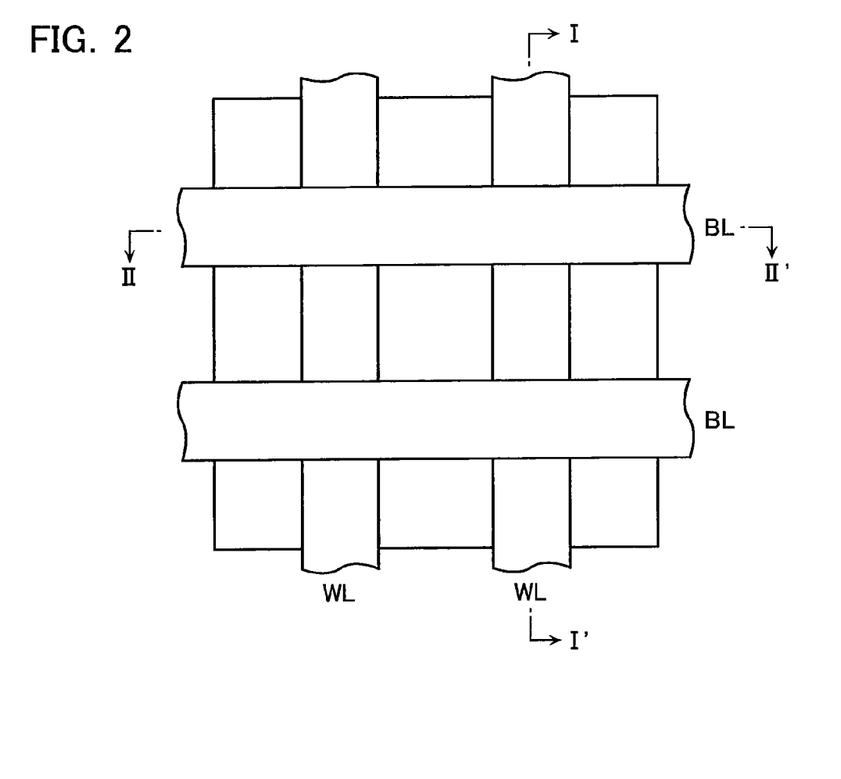
FIG. 2 is a plan view of the cell array in the nonvolatile memory of FIG. 1.
Figure 3A:
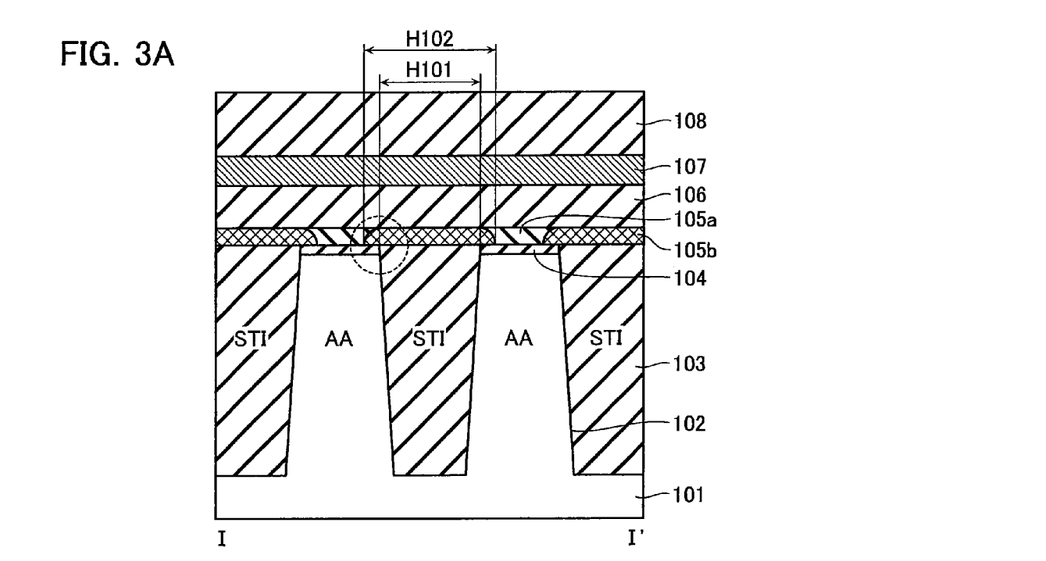
FIGS. 3A and 3B are cross-sectional views taken along the line I-I' of FIG. 2.
Figure 3B:
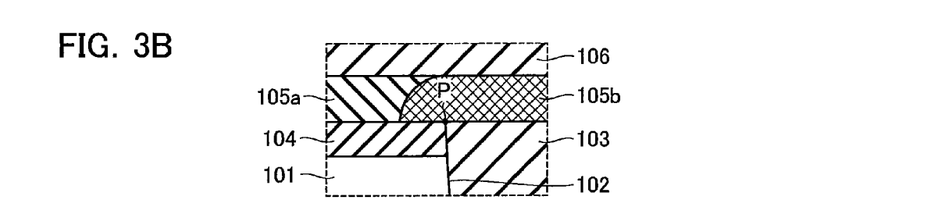

FIG. 2 is a plan view of this cell array, FIG. 3A is a cross-sectional view taken along an I-I' direction of FIG. 2, and FIG. 3B is an enlarged view of a region surrounded by a dotted line of FIG. 3A. Note that a cross-section taken along an II-II' direction of FIG. 2 is identical to that of an ordinary NAND flash memory, and is therefore not shown.

The memory cell transistor MTi of the present embodiment is configured by a transistor with a MONOS type structure as mentioned above.

Specifically, the memory cell transistor MTi is disposed on a silicon (Si) substrate 101 that is a semiconductor substrate. A plurality of element isolation trenches 102 are disposed in this silicon substrate 101 so as to extend in a bit line BL direction that is a first direction and so as to reach a certain depth from a surface of the silicon substrate 101. Furthermore, an element isolation insulating film 103 formed, for example, using ALD (Atomic Layer Deposition) and constituted from $SiO_2$ (ALD-$SiO_2$), that is, a so-called STI (Shallow Trench Isolation) is formed in these element isolation trenches 102. Note that, in addition to ALD-$SiO_2$, the following may also be utilized as a material of the element isolation insulating film 103, namely NSG (Non Doped Silicate Glass), BPSG (Boron Phosphorous Silicon Glass), HTO (High Temperature Oxide), TEOS (Tetra Ethyl Ortho Silicate), PSZ (Polysilazane), and so on. Now, in the following description, a region of the silicon substrate 101 between adjacent element isolation insulating films 103 is called an element region AA. Disposed on an upper surface of this element region AA is a tunnel insulating film 104 of a certain thickness (for example, 2-10 nm). This tunnel insulating film 104 may have a single-film structure configured by a silicon oxide film ($SiO_2$). Alternatively, it may have a stacking structure of the likes of a silicon nitride film (SiN)/silicon oxide film, silicon oxide film/silicon nitride film/silicon oxide film, silicon oxide film/high dielectric constant film/silicon oxide film, or high dielectric constant film/silicon oxide film.

In addition, a charge storage film 105 including a charge trap is stacked in a continuous manner on the element region AA and the element isolation insulating film 103. This charge storage film 105 comprises a charge film 105a having a certain charge trapping characteristic, and a degraded charge film 105b having a charge trapping characteristic and charge mobility inferior to that of the charge film 105a. As shown in FIG. 3A, this degraded charge film 105b reaches from a lower surface to an upper surface of the charge storage film 105 and separates adjacent charge films 105a. Moreover, this degraded charge film 105b is formed by an oxidizing agent (for example, moisture ($H_2O$)) included in the element isolation insulating film 103 being diffused by heat and oxidizing a material of the charge storage film 105. Since this oxidizing agent is diffused isotropically from the element isolation insulating film 103, a cross-section in the I-I' direction of the degraded charge film 105b becomes near-trapezoidal in shape wherein a length H101 of an upper surface of the degraded charge film 105b is shorter than a length H102 of a lower surface of the degraded charge film 105b in contact with the element isolation insulating film 103, as shown in FIG. 3A. In the detail, a boundary between the charge film 105a and the degraded film 105b in a cross section along the I-I' direction has an upwardly-convex arc-like shape, as shown in FIG. 3B. The arc-like boundary is formed with its center near an upper end P of a boundary between the element isolation insulating film 103 and the tunnel insulating film 104 in the I-I' cross section, and has a convex shape toward the charge film 105a. Here, the charge film 105a may have a single-film structure configured by a silicon nitride film or a hafnium aluminate film (HfAlO). Alternatively, it may have a multilayer film structure including a high dielectric constant film with a dielectric constant higher than that of a silicon oxide film. The high dielectric film includes an alumina film ($Al_2O_3$), magnesium oxide film (MgO), strontium oxide film (SrO), barium oxide film (BaO), titanium oxide film ($TiO_2$), tantalum oxide film ($Ta_2O_5$), barium titanium oxide film ($BaTiO_3$), barium zirconium oxide film (BaZrO), zirconium oxide film ($ZrO_2$), hafnium oxide film ($HfO_2$), yttrium oxide film ($Y_2O_3$), zirconium silicate film (ZrSiO), hafnium silicate film (HfSiO), lanthanum aluminate film (LaAlO) and the like. Specifically, the charge film 105a may employ a multilayered film structure formed of a silicon nitride film, a high dielectric constant film, and a silicon nitride film which are stacked on the tunnel insulating layer 104 in this order. Alternatively, it may employ a multilayered film structure of hafnium aluminate film/high dielectric constant film/silicon nitride film, silicon nitride film/high dielectric constant film/hafnium aluminate film, or hafnium aluminate film/high dielectric constant film/hafnium aluminate film. In addition, regarding the silicon nitride film, either a ratio of x or y in $Si_xN_y$ may be increased compared to the other.

Furthermore, a block insulating film 106, a control gate electrode 107, and a spacer 108 are stacked sequentially on the charge storage film 105. Here, in addition to a silicon oxide film, a film having a dielectric constant higher than a silicon oxide film may also be utilized as the block insulating film 106, The high dielectric constant film may include an alumina film, magnesium oxide film, strontium oxide film, silicon nitride film, barium oxide film, titanium oxide film, tantalum oxide film, barium titanium oxide film, barium zirconium oxide film, zirconium oxide film, hafnium oxide film, yttrium oxide film, zirconium silicate film, hafnium silicate film, or lanthanum aluminate film and the like. In addition, the block insulating film 106 may have a multilayer film structure including these high dielectric constant films. Specifically, the block insulating film 106 may employ a multilayered film structure formed of a silicon oxide film, a high dielectric constant film, and a silicon oxide film which are stacked on the charge storage film 105 in this order. Alternatively, it may employ a multilayered film structure of silicon oxide film/ high dielectric constant film, high dielectric constant film/ silicon oxide film, or high dielectric constant film/silicon oxide film/high dielectric constant film. Moreover, the control gate electrode 107 may have a single-film structure configured by polysilicon, a metal compound of silicon (silicide), a metal oxide, or a metal (tungsten (W), tantalum silicon nitride (TaSiN), tantalum (Ta), titanium silicide (TiSi), titanium nitride (TiN), cobalt (Co), platinum (Pt) or the like). Alternatively, it may have a multilayer film structure of these.

[Method of Manufacturing Memory Cell Transistor MTi]

Next, a method of manufacturing the memory cell transistor MTi of the present embodiment is described with reference to FIGS. 4A-4D. The case is described here where an ALD-$SiO_2$ film is used for the element isolation insulating film 103, a silicon oxide film is used for the tunnel insulating film 104, and a silicon nitride film is used for the charge storage film 105.

Figure 4A:
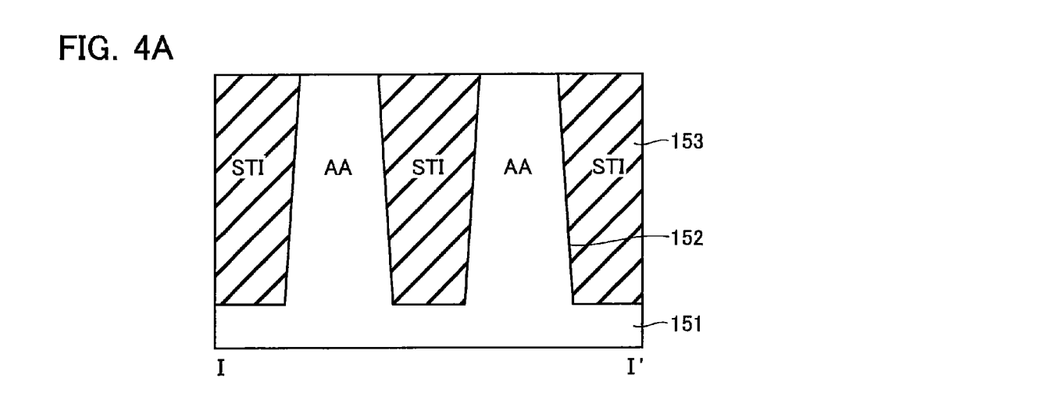
FIGS. 4A-4D are cross-sectional views showing manufacturing processes of a memory cell transistor in the nonvolatile memory of FIG. 1.

As shown in FIG. 4A, RIE is used on a silicon substrate 151 (silicon substrate 101 shown in FIGS. 3A and 3B) to form a plurality of element isolation trenches 152 (element isolation trench 102 of FIGS. 3A and 3B) with a certain spacing therebetween (for example, 50 nm) in the bit line direction and reaching a certain depth (for example, 200-400 nm) from a surface of the semiconductor substrate 151. The element isolation trench 152 is filled with an ALD-$SiO_2$ film 153 including moisture ($H_2O$) that is an oxidizing agent, thereby forming the element isolation insulating film 103 shown in FIG. 3. Here, CMP may be used to planarize an upper surface of the ALD-$SiO_2$ film 153 if required. In addition, a surface of the ALD-$SiO_2$ film 153 may be etched back to set a height of a surface of the element isolation insulating film 103 lower than a height of a surface of the element region AA. In this case, an opposing area of the charge film 105b and the control gate electrode 107 becomes large, and capacitance coupling between the charge film 105b and the control gate electrode 107 can therefore be increased.

Figure 4B:
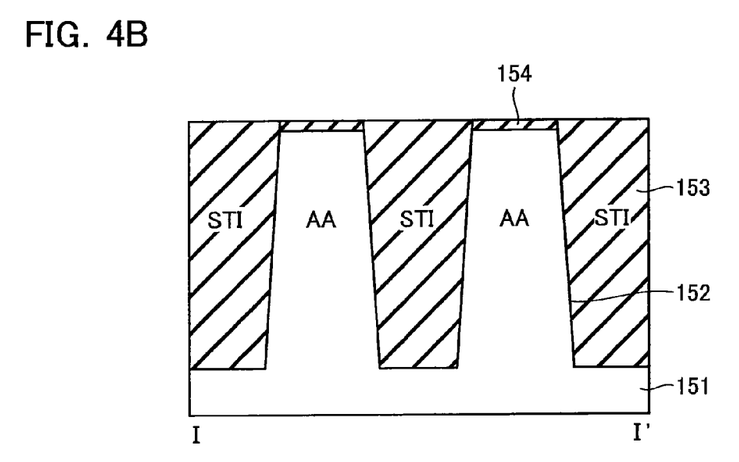

As shown in FIG. 4B, an upper surface of the element region AA of the silicon substrate 151 is, for example, oxidized to form a silicon oxide film 154 that becomes the tunnel insulating film 104.

Figure 4C:
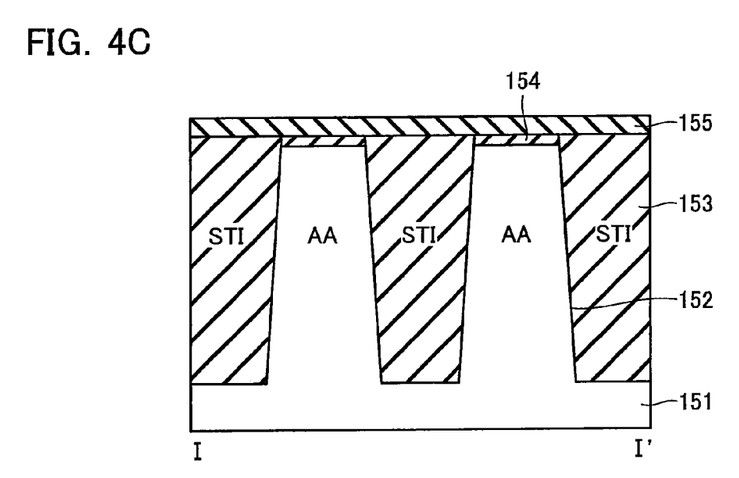

As shown in FIG. 4C, a silicon nitride film 155 that becomes the charge storage film 105 is deposited on the ALD-$SiO_2$ film 153 and the silicon oxide film 154.

Figure 4D:
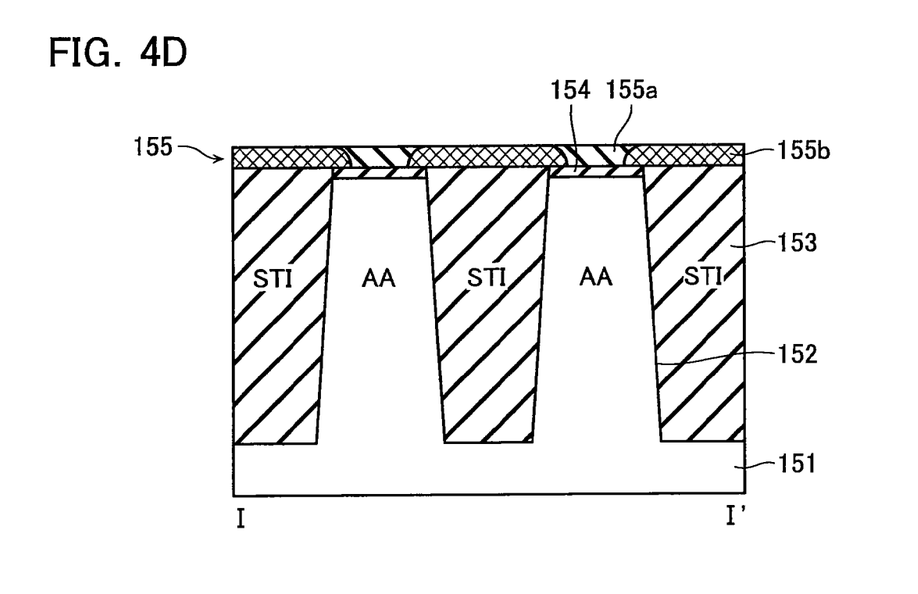

As shown in FIG. 4D, heat treatment is applied to the ALD-$SiO_2$ film 153, thereby diffusing the moisture ($H_2O$) included in the ALD-$SiO_2$ film 154 into the silicon nitride film 155. This result in a film quality of a portion of the silicon nitride film 155 on the upper surface of the ALD-$SiO_2$ film 153 being oxidized. That is, the silicon nitride film 155 is oxidized to become a silicon oxynitride film. In this case, a material of the degraded charge film 105b is the silicon oxynitride film. A degraded silicon nitride film 155b formed by this oxidation is the degraded charge film 105b shown in FIG. 3. On the other hand, a silicon nitride film 155a which is an unoxidized portion of the silicon nitride film 155 is the charge film 105a shown in FIG. 3.

Films that become the block insulating film 106, the control gate electrode 107, and the spacer 108 are formed sequentially on the silicon nitride film 155a and the degraded silicon nitride film 155b. The memory cell transistor MTi of the MONOS type structure shown in FIG. 3 is thereby completed.

Note that, although, in the above-described method of manufacturing, formation of the degraded silicon nitride film 155b is performed prior to formation of the block insulating film 106, this degraded silicon nitride film 155b may be formed subsequent to formation of the block insulating film 106 and control gate electrode 107 either before or after formation of the spacer 108.

Figure 5:
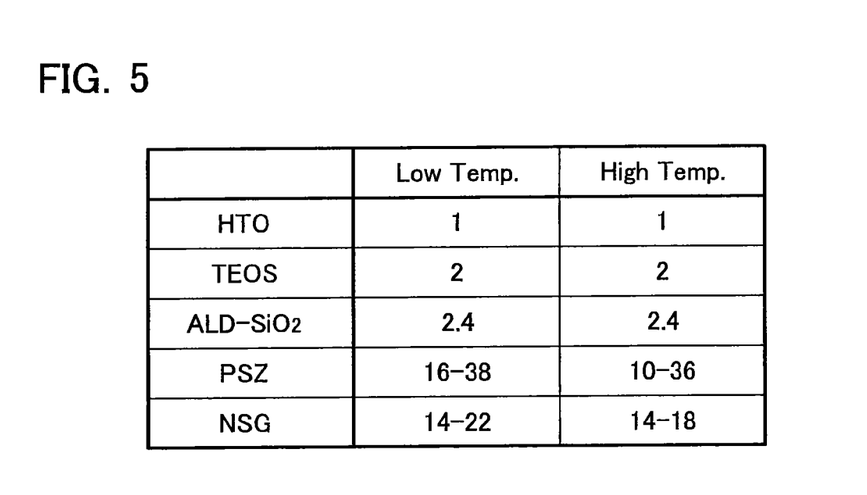
FIG. 5 is a graph of moisture ($H_2O$) deposition amount subsequent to heat treatment according to material of an element isolation insulating film.

A material of the element isolation insulating film 103 is now described. FIG. 5 is a table comparing moisture ($H_2O$) deposition amount subsequent to heat treatment for each of various materials. FIG. 5 here is a table showing a relative comparison of moisture (H$_2$O) deposition amount subsequent to heat treatment where HTO is assumed to be 1. Note that "Low Temp." indicates the moisture deposition amount when heat treatment is performed between room temperature and about 450 degrees, and "High Temp." indicates the moisture deposition amount when heat treatment is performed at 450 degrees and above. It is clear from FIG. 5 that moisture (H$_2$O) deposition amount subsequent to heat treatment increases in order of HTO, TEOS and ALD-SiO$_2$, NSG, and PSZ. Alternatively, it may have a multilayer film structure of these. PSZ or NSG could therefore be said to be preferable from among these materials, if the heat process subsequent to formation of the degraded silicon nitride film 155*b* is considered.

[Method of Manufacturing Peripheral Transistor]

This concludes description of the method of manufacturing the memory cell transistor, but it should be noted that the heat treatment applied during formation of the degraded silicon nitride film 155*b* in the above-described method of manufacturing imparts effects on ion concentration or the like in a channel regions of peripheral transistors such as select transistors ST1, ST2, and the like.

Accordingly, a method of forming a channel region of a peripheral transistor that takes into account the effects of heat treatment is described below.

There are two methods of forming a channel region of a peripheral transistor, namely, a method in which the channel region is formed prior to formation of the element isolation insulating film 103 and a method in which the channel region is formed subsequent to formation of the element isolation insulating film 103.

In the former method, first, ion implantation is performed on the silicon substrate 171; then, the ALD-SiO$_2$ film 153, silicon oxide film 154, and silicon nitride film 155 of the memory cell transistor MTi are formed, and heat treatment is applied. As a result, the dosing amount of ions implanted into the silicon substrate 171 is made larger than in the case where no heat treatment is applied. Moreover, since this heat treatment causes a profile to extend, a range of ion implantation is set narrower in advance than in the case where no heat treatment is applied.

Figure 6:
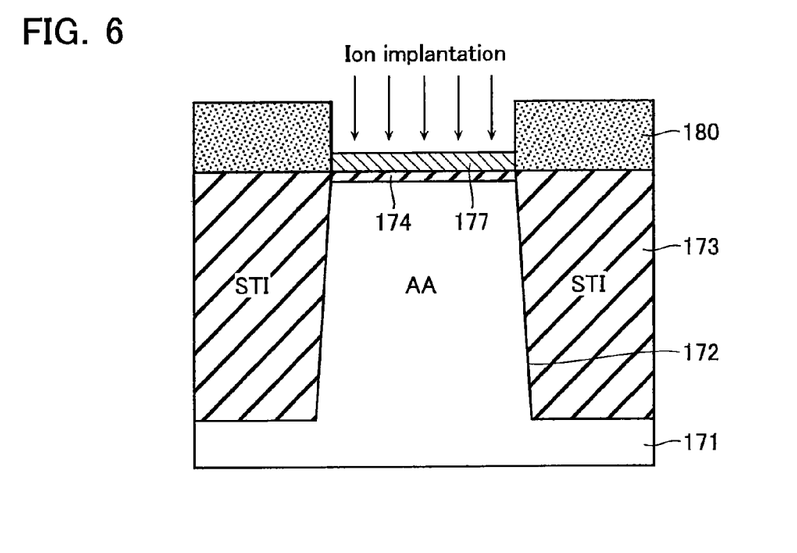
FIG. 6 is a cross-sectional view describing formation of a channel region in a peripheral transistor of the nonvolatile memory of FIG. 1.

In the latter method, as shown in FIG. 6, first, heat treatment is used to form the degraded silicon nitride film 155*b*; then, upon application of resist 180 on the element isolation insulating film 173, ions are implanted from above the gate electrode 177. In such a case where ions are implanted subsequent to the heat treatment, effects due to heat treatment have no influence on ion implantation conditions. Note that a thickness of the gate insulating film 174 of the peripheral transistor is 20-50 nm in the case of a high voltage transistor (HVTr) and 5-10 nm in the case of a low voltage transistor (LVTr).

As is clear from the above, since no element isolation insulating film 103 is formed using RIE prior to formation of the tunnel insulating film 104 and charge film 105*a* in the present embodiment, the present embodiment may avoid RIE-induced damage to side surfaces of the tunnel insulating film 104 and charge film 105*a*. In addition, the degraded charge film 105*b* having an inferior charge-trapping characteristic and an inferior charge mobility is interposed between the charge films 105*a* of adjacent memory cell transistors MTi, thereby preventing charge shifting between the charge films 105*a*. As a result, the retention characteristic can be improved in comparison with a structure where the charge film is separated by RIE. Moreover, charge shifting between charge films 155, which is a concern in a conventional memory cell transistor having a structure where charge films are joined, does not readily occur.

In addition, since the degraded charge film 105*b* is formed by diffusing the oxidizing agent included in the element isolation insulating film 103, the memory cell transistors MTi aligned in the I-I' direction can be isolated in a self-aligning manner. That is, misalignment of the element region AA and the charge film 105*a* does not readily occur.

Figure 7:
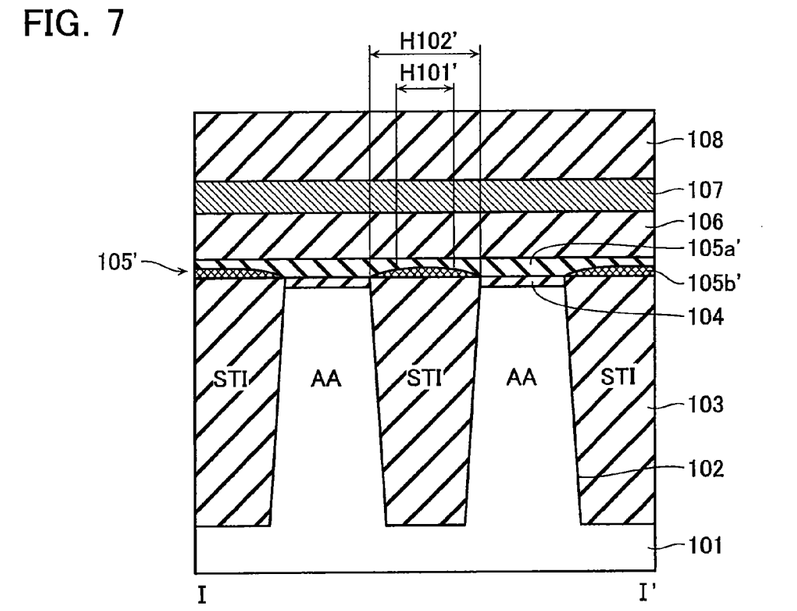
FIG. 7 is another cross-sectional view taken along the line I-I' of FIG. 2.

Note that, although the memory cell transistor MTi shown in FIG. 3 has a structure in which the degraded charge film 105*b* extends from a lower surface of to reach an upper surface of the charge storage film 105 and completely isolates between adjacent charge films 105*a*, a degraded charge film 105*b'* may alternatively be formed with a certain thickness extending from a lower surface of but not reaching an upper surface of a charge storage film 105', as shown in FIG. 7. In this case, a boundary between a charge film 105*a'* and the degraded charge film 105*b'* in a cross-section in the I-I' direction attains substantially an upwardly-convex arc shape having an upper surface of the element isolation insulating film 102 as a chord. If a central vicinity of this arc is approximated to a straight line, the degraded charge film 105*b'* could be said to have a shape that is near-trapezoidal wherein a length H101' of this straight line is shorter than a length H102' of the lower surface of the degraded charge film 105*b'*. Even in this case, charge shifting between adjacent memory cell transistors MTi can be suppressed since the charge film 105*a* between adjacent memory cell transistors MTi is thin. Moreover, since a length in the I-I' direction of the charge film 105*a'* becomes greater, a range in which charge can be trapped in the charge film 105*a* can be increased in comparison with the case of FIG. 3.

Second Embodiment

Figure 8:
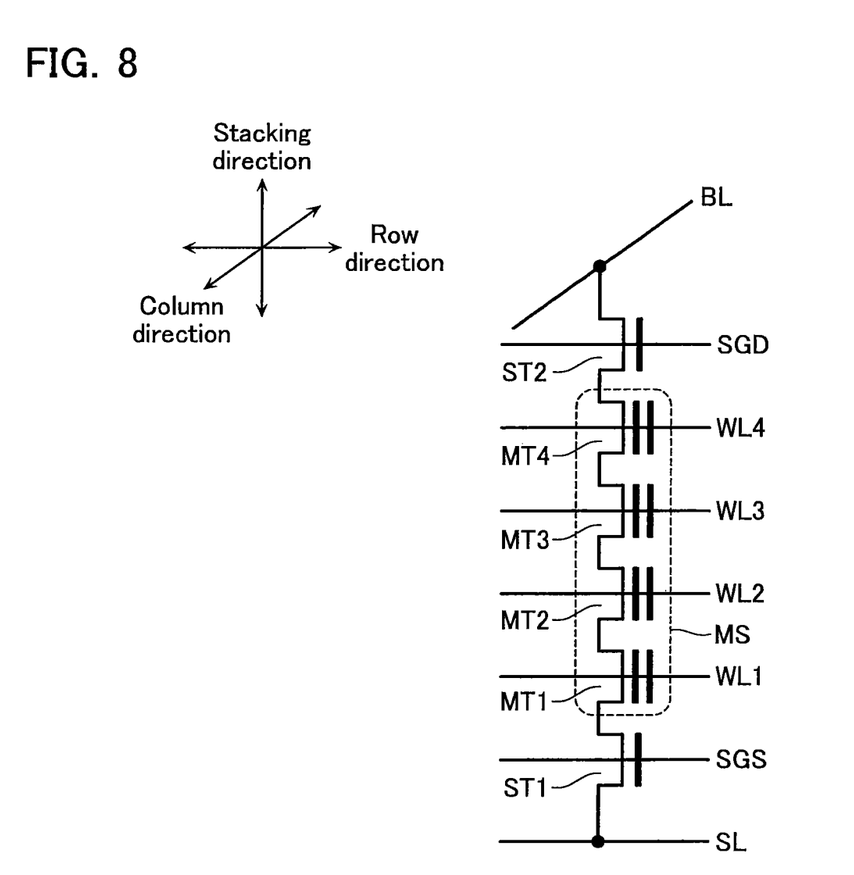
FIG. 8 is an equivalent circuit diagram of a memory string in a nonvolatile memory in accordance with a second embodiment of the present invention.

A nonvolatile memory in accordance with a second embodiment of the present invention is configured with a structure having a cell array stacked three-dimensionally to increase a degree of memory integration. FIG. 8 is an equivalent circuit diagram of a part of this cell array.

Specifically, this nonvolatile memory comprises, a source line SL, a source side select gate line SGS, a plurality of word lines WL1-WL4, and a drain side select line SGD. These lines are stacked from a lower layer to an upper layer, and extend in the row direction. Furthermore, formed in a layer even higher than that of this drain side select gate line SGD is a bit line BL extending in the column direction. In addition, disposed between the source line SL and the bit line BL from the lower layer to the upper layer are a select transistor ST1, a memory string MS comprising a plurality of memory cell transistors MT1-MT4 connected in series, and a select transistor ST2. The source side select gate line SGS, the word lines WL1-WL4, and the drain side select gate line SGD are connected to gates of the select transistor ST1, the memory cell transistors MT1-MT4, and the select transistor ST2 are, respectively.

Figure 9A:
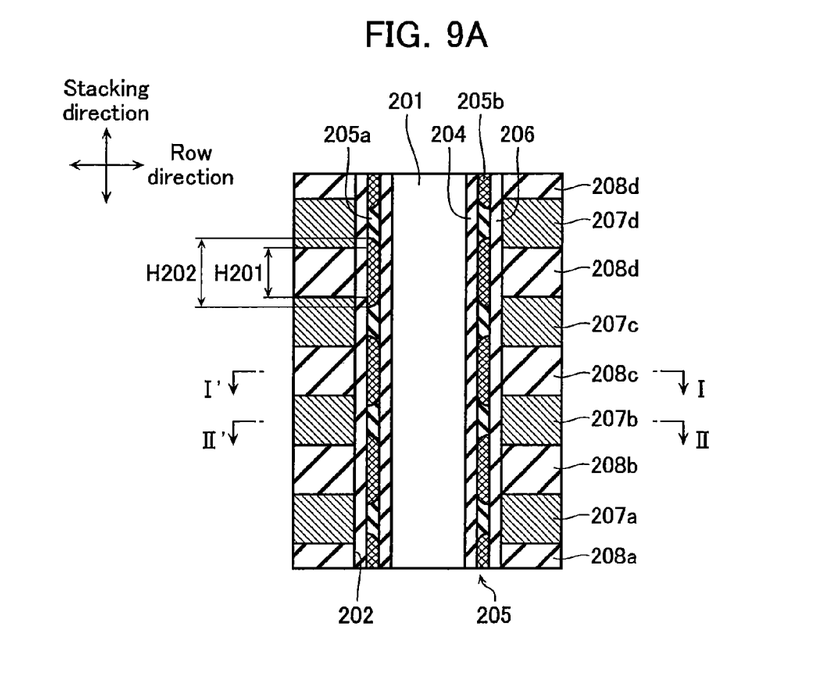
FIGS. 9A-9C are cross-sectional views of the memory string in the nonvolatile memory of FIG. 8.
Figure 9B:
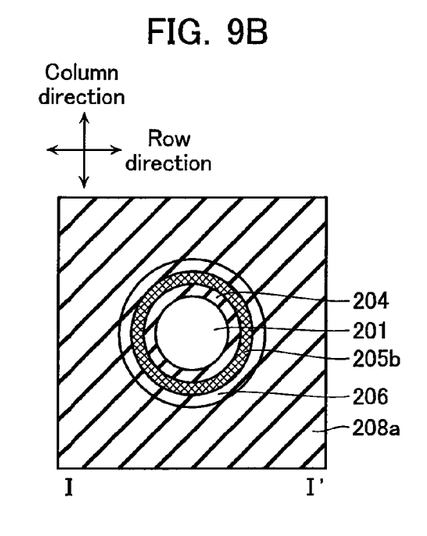
Figure 9C:
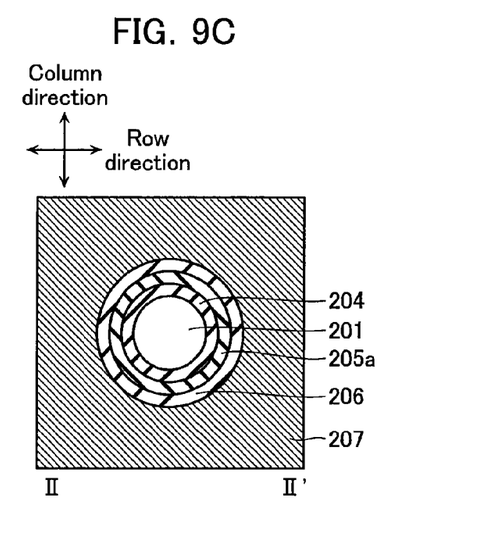

FIG. 9A is a cross-sectional view in the row direction and stacking direction of the memory string MS portion surrounded by a dotted line of FIG. 8; FIG. 9B is a cross-sectional view taken along the I-I' direction of FIG. 9A; and FIG. 9C is a cross-sectional view taken along the II-II' direction of FIG. 9A.

This memory string MS has word line conductive films 207*a*-207*d*, as wiring conductive films that become the word lines WL1-WL4. These films 207*a*-207*d* are disposed from the lower layer to the upper layer.

Inter-word line insulating films 208 as inter-line insulating film formed of ALD-SiO$_2$ are formed between the word line conductive films 207, respectively. NSG, BPSG, HTO, TEOS, PSZ and the like may also be utilized here as a material of the inter-word line insulating films 208, as well as ALD-$SiO_2$. Alternatively, it may have a multilayer film structure of these. In addition, a memory hole 202 is formed to penetrate these word line conductive films 207 and inter-word line insulating films 208 in the stacking direction. Formed within the memory hole 202 is a memory columnar semiconductor film 201 having a cylindrical column shape. Moreover, a block insulating film 206, charge storage film 205, and tunnel insulating film 204 are formed sequentially on a side wall exposed the word line conductive films 207 and the inter-word line insulating films 208 by the memory hole 202.

Now, the charge storage film 205 comprises a charge film 205a positioned at the same height in the stacking direction as the word line conductive films 207 and having a certain charge trapping characteristic, and a degraded charge film 205b positioned at the same height in the stacking direction as the inter-word line insulating films 208 and having a charge trapping characteristic and charge mobility inferior to that of the charge film 205a.

This degraded charge film 205b is formed by an oxidizing agent (for example, moisture ($H_2O$)) included in the inter-word line insulating film 208 being diffused by heat and, subsequent to passing through the block insulating film 206, oxidizing a material of the charge storage film 205. Since this oxidizing agent is diffused isotropically from the inter-word line insulating film 208, a cross-section in the row direction and stacking direction of the degraded charge film 205b becomes near-trapezoidal in shape. That is, a length H201 of a boundary between the degraded charge film 205b and the tunnel insulating film 204 is shorter than a length H202 of a boundary between the degraded charge film 205b and the block insulating film 206.

Normally, in the case of nonvolatile memory similar to that of the present embodiment in which the cell array is stacked three-dimensionally, the charge films of adjacent memory cell transistors configuring the memory string MS are formed in a continuous manner. Consequently, charge shifting occurs between adjacent memory cell transistors.

In the present embodiment, similarly in this respect to the first embodiment, interposing the degraded charge film 205b between adjacent charge films 205a prevents charge shifting between adjacent memory cell transistors MTi. As a result, the retention characteristic of the memory cell transistors MTi can be improved.

Third Embodiment

Figure 10:
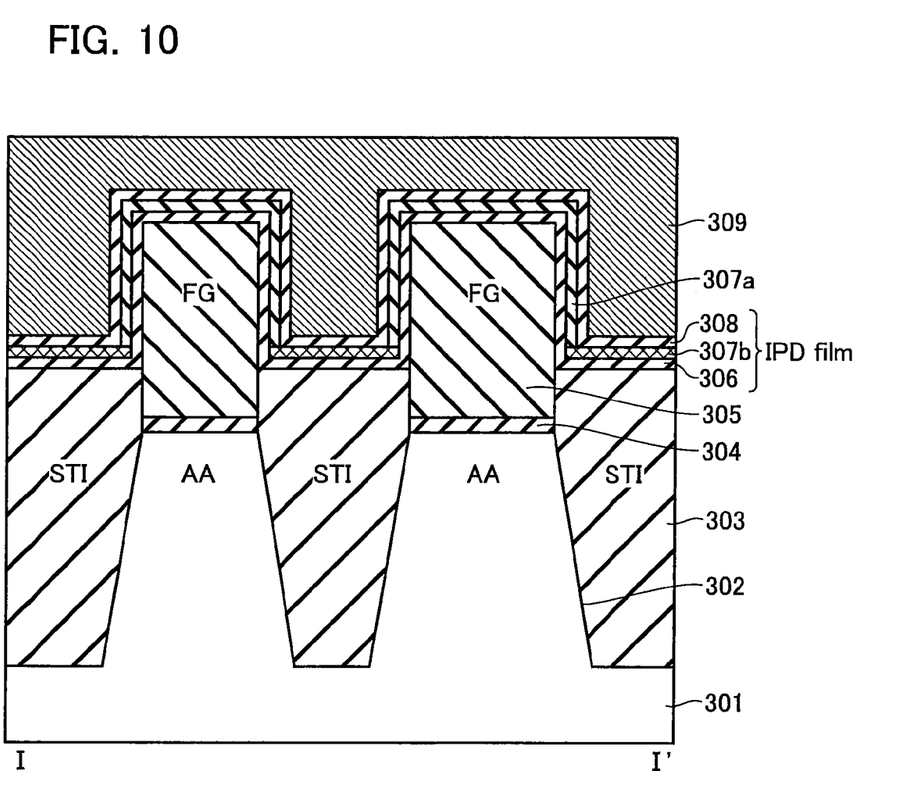
FIG. 10 is a cross-sectional view of a cell array in a nonvolatile memory in accordance with a third embodiment of the present invention.

A nonvolatile memory in accordance with a third embodiment of the present invention is a flash memory configured from so-called floating gate type memory cell transistors. An equivalent circuit diagram of a cell array in this nonvolatile memory is similar to that of FIG. 1 and is thus omitted. FIG. 10 is a cross-sectional view taken along the I-I' line of FIG. 2.

The nonvolatile memory in accordance with the present embodiment is formed on a silicon substrate 301. A plurality of element isolation trenches 302 are formed in this silicon substrate 301 so as to extend in a bit line BL direction that is a second direction and so as to reach a certain depth from a surface of the silicon substrate 301. An element isolation insulating film 303, that is, a so-called STI is formed in these element isolation trenches 302. NSG, BPSG, HTO, TEOS, PSZ and the like may also be utilized as a material of the element insulating film 303, as well as ALD-$SiO_2$, similarly to the element isolation insulating film 103 of the first embodiment. Alternatively, it may have a multilayer film structure of these. Element regions AA are sandwiched between two of the isolation insulating films 303 adjacent on the silicon substrate 301. A tunnel insulating film 304 composed of a silicon oxide film or the like sequentially on the element region AA. Disposed sequentially on an upper surface of an element region AA sandwiched between two element isolation insulating films 303 adjacent in a word line direction on the silicon substrate 301 are a tunnel insulating film 304 configured from a silicon oxide film or the like of a certain thickness and a floating gate 305. Disposed covering this tunnel insulating film 304 and floating gate 305 are an IPD film (inter-gate multilayer film) of a certain thickness, and a control gate 309 further covering the IPD film.

Here, an upper surface of the element isolation insulating film 303 is higher than an upper surface of the tunnel insulating film 304 and lower than an upper surface of the floating gate 305. In addition, the IPD film comprises a multilayer structure having first through third inter-gate films 306-308 stacked sequentially from a lower layer to an upper layer. Of these, the first and third inter-gate layers 306 and 308 are formed from an insulating material of the likes of silicon oxide, for example.

On the other hand, the second inter-gate film 307 has a portion thereof facing an upper surface and side surfaces of the floating gate 305 (side surface portion 307a) formed from a high dielectric constant material of the likes of silicon nitride, and a portion thereof facing an upper surface of the element isolation insulating film 303 (upper surface portion 307b) formed from a material oxidized the side surface portion 307a. Note that the upper surface portion 307b can be formed by oxidizing the high dielectric constant material as a material of the second inter-gate film 307 stacked in advance. The oxidation is performed using an oxidizing agent included in the element isolation insulating film 303, similarly to the degraded charge film 105b in the first embodiment.

The upper surface of the floating gate 305 at a position is higher than that of the upper surface of the element isolation insulating film 303 in this way, it leads to the control gate 309 facing not only the upper surface but also the side surfaces of the floating gate 305 and thereby allows the control gate 309 to secure a high coupling ratio with the floating gate 305.

In addition, giving the above-described three-layer structure to tunneling of electrons through the IPD film to be suppressed, thereby preventing discharge of electrons from the floating gate 305 to the control gate 309 during a program operation and injection of electrons from the control gate 309 to the floating gate 305 during an erase operation. As a result, a leak current in the IPD film can be reduced and the retention characteristic improved over the case of an IPD film with a single-layer structure configured by a silicon oxide film.

Furthermore, if a material such as a silicon nitride film having numerous charge traps is used for the second inter-gate film 307, charge stored in one floating gate 305 shifts to other floating gates 305 adjacent to the one floating gate 305 via charge traps in the upper surface portion 307b. As a result, an amount of charge stored in the floating gate 305 varies, whereby data variation is caused.

Now, the upper surface portion 307b in a portion of the second inter-gate film 307 is disposed on the upper surface of the element isolation insulating film 303, that is, between element regions AA adjacent in the word line WL direction. Then it is possible to prevent charge stored in one floating gate 305 shifting to other floating gates 305 adjacent to the one floating gate 305 via charge traps in the upper surface portion 307b. As a result, the leak current in the IPD film can be further reduced in comparison with the case where the second inter-gate film 307 is formed entirely from the high dielectric constant material.

Moreover, the side surface portion 307a is not oxidized by the oxidizing agent included in the element isolation insulating film 303. The dielectric constant of the IPD film formed on the side surface of the floating gate 305 is therefore not lowered. As a result, the control gate 309 can secure a high coupling ratio with the floating gate 305.

Other Embodiments

This concludes description of embodiments of the present invention, but it should be noted that the present invention is not limited to the above-described embodiments, and that various alterations, additions, and so on, are possible within a range not departing from the scope and spirit of the invention.

What is claimed is:

1. A nonvolatile semiconductor memory device, comprising:
    wiring conductive films and inter-line insulating films that are stacked in plurality alternately;
    a memory hole extending in a stacking direction of the wiring conductive films and the inter-line insulating films, and penetrating the wiring conductive films and the inter-line insulating films;
    a block insulating film, a charge storage film, and a tunnel insulating film that are formed sequentially on an inner wall of the memory hole; and
    a memory columnar semiconductor film formed on an inner wall of the tunnel insulating film,
    the charge storage film comprising:
    a charge film facing the wiring conductive film via the block insulating film; and
    a degraded charge film facing the inter-line insulating film via the block insulating film and having a charge trapping characteristic inferior to that of the charge film, and
    the degraded charge film having a length of a boundary between the degraded charge film and the tunnel insulating film being shorter than a length of a boundary between the degraded charge film and the block insulating film in a cross-section along the stacking direction.

2. The nonvolatile semiconductor memory device according to claim 1, wherein the degraded charge film comprises a same element of the charge film and oxygen.

3. The nonvolatile semiconductor memory device according to claim 2, wherein the charge film is made from silicon nitride.

4. The nonvolatile semiconductor memory device according to claim 2, wherein the degraded charge film is made from siliconoxynitride.

* * * * *